United States Patent
Mustafa et al.

(10) Patent No.: US 10,704,142 B2
(45) Date of Patent: Jul. 7, 2020

(54) QUICK DISCONNECT RESISTANCE TEMPERATURE DETECTOR ASSEMBLY FOR ROTATING PEDESTAL

(71) Applicant: APPLIED MATERIALS, INC., Santa Clara, CA (US)

(72) Inventors: Muhannad Mustafa, Santa Clara, CA (US); Muhammad M. Rasheed, San Jose, CA (US); Mario Dan Sanchez, San Jose, CA (US); Yu Chang, San Jose, CA (US); William Kuang, Sunnyvale, CA (US); Vinod Konda Purathe, Bangalore (IN); Manjunatha Koppa, Bengaluru (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 368 days.

(21) Appl. No.: 15/661,441

(22) Filed: Jul. 27, 2017

(65) Prior Publication Data
US 2019/0032210 A1    Jan. 31, 2019

(51) Int. Cl.
*C23C 16/455* (2006.01)
*G01K 7/16* (2006.01)
(Continued)

(52) U.S. Cl.
CPC .... *C23C 16/45544* (2013.01); *C23C 16/4584* (2013.01); *C23C 16/4586* (2013.01);
(Continued)

(58) Field of Classification Search
CPC ........ H01J 37/32715–32724; H01L 21/68792; C23C 16/4584
See application file for complete search history.

(56) References Cited

U.S. PATENT DOCUMENTS 4,821,674 A * 4/1989 Deboer ............ H01L 21/67248
                                                      118/666
5,356,476 A    10/1994 Foster et al.
(Continued)

FOREIGN PATENT DOCUMENTS

JP    2002-026399 A    1/2002

OTHER PUBLICATIONS

U.S. Appl. No. 15/421,964, filed Feb. 1, 2017, Rasheed et al.
(Continued)

*Primary Examiner* — Charlee J. C. Bennett
(74) *Attorney, Agent, or Firm* — Moser Taboada; Alan Taboada

(57) ABSTRACT

Embodiments of the present disclosure are directed to a quick disconnect resistance temperature detector (RTD) heater assembly, that includes a first assembly comprising a pedestal, a pedestal shaft, an adapter, one or more heater power supply terminals, and at least one RTD, and a second assembly comprising a rotating module having a central opening, and a cable assembly partially disposed in the central opening and securely fastened to the rotating module, wherein the first assembly is removably coupled to the second assembly, wherein the cable assembly includes one or more power supply sockets that receive the heater power supply terminals when the first and second assemblies are coupled together, and wherein the cable assembly includes one or more spring loaded RTD pins that contact the at least one RTD disposed in the first assembly when the first and second assemblies are coupled together.

20 Claims, 4 Drawing Sheets

(51) Int. Cl.
  *C23C 16/46* (2006.01)
  *G01K 13/08* (2006.01)
  *G01K 1/14* (2006.01)
  *C23C 16/458* (2006.01)

(52) U.S. Cl.
  CPC .............. *C23C 16/46* (2013.01); *G01K 1/146* (2013.01); *G01K 7/16* (2013.01); *G01K 13/08* (2013.01)

(56) References Cited

U.S. PATENT DOCUMENTS

| | | | | |
|---|---|---|---|---|
| 5,855,675 | A * | 1/1999 | Doering | C23C 16/44 118/719 |
| 5,983,644 | A * | 11/1999 | Bolandi | H01L 21/67103 62/3.2 |
| 6,066,836 | A * | 5/2000 | Chen | C23C 16/46 118/725 |
| 6,213,478 | B1 * | 4/2001 | Nishikawa | C23C 16/4584 118/500 |
| 6,363,623 | B1 * | 4/2002 | Abraham | H01L 21/68728 134/149 |
| 6,376,808 | B2 | 4/2002 | Tachikawa et al. | |
| 7,967,538 | B1 * | 6/2011 | Coope | F16B 41/002 411/348 |
| 10,204,805 | B2 * | 2/2019 | Yousif | H01L 21/67103 |
| 2002/0096117 | A1 * | 7/2002 | Futamura | C23C 16/4586 118/729 |
| 2003/0094773 | A1 | 5/2003 | Lemer | |
| 2006/0093531 | A1 * | 5/2006 | Tremoulet, Jr. | A23L 3/0155 422/107 |
| 2007/0032097 | A1 * | 2/2007 | Chen | H01L 21/6719 438/795 |
| 2008/0152458 | A1 * | 6/2008 | Bauer | F16B 41/002 411/369 |
| 2008/0314320 | A1 * | 12/2008 | Balma | C23C 16/4586 118/728 |
| 2009/0120368 | A1 * | 5/2009 | Lubomirsky | C23C 16/4409 118/733 |
| 2011/0005686 | A1 * | 1/2011 | Tanaka | H01L 21/68757 156/345.52 |
| 2012/0063874 | A1 * | 3/2012 | Kremerman | B25J 9/042 414/744.3 |
| 2012/0164834 | A1 * | 6/2012 | Jennings | H01J 37/32082 438/694 |
| 2012/0269653 | A1 * | 10/2012 | Lutoslawski | B60K 25/02 417/44.1 |
| 2014/0087587 | A1 * | 3/2014 | Lind | H01L 21/68792 439/527 |
| 2014/0263275 | A1 * | 9/2014 | Nguyen | H01L 21/67109 219/446.1 |
| 2015/0083042 | A1 * | 3/2015 | Kobayashi | H01J 37/32082 118/500 |
| 2016/0076971 | A1 * | 3/2016 | Hirokawa | F23Q 7/001 73/114.18 |
| 2017/0076915 | A1 * | 3/2017 | Boyd, Jr. | H01J 37/32697 |
| 2018/0158716 | A1 * | 6/2018 | Konkola | H01L 21/68742 |
| 2019/0181028 | A1 * | 6/2019 | Patel | H01L 21/68785 |

OTHER PUBLICATIONS

U.S. Appl. No. 15/657,190, filed Jul. 23, 2017, Nemani et al.
International Search Report and Written Opinion dated Nov. 30, 2108 for PCT Application No. PCT/US2018/041743.

* cited by examiner

QUICK DISCONNECT RESISTANCE TEMPERATURE DETECTOR ASSEMBLY FOR ROTATING PEDESTAL

FIELD

The present disclosure relates generally to apparatus and methods for improving deposition uniformity. In particular, embodiments of the disclosure are directed to a quick disconnect resistance temperature detector (RTD) assembly for an in-chamber rotating pedestal.

BACKGROUND

In many deposition chambers, both atomic layer deposition and chemical vapor deposition, rotating pedestal/heaters are used to improve non-uniformity. In most cases, non-uniformity comes from non-uniform chemical delivery, flow distribution, chamber features, and temperature non-uniformity from the chamber body and surrounding components. Using a rotating pedestal can distribute the local effect of these variations and improve the non-uniformity.

However, in some cases, non-uniformity can be contributed by the pedestal or the heater itself, especially when the substrate (wafer) sits on or contacts the heater. The impact of local non-uniform temperature distribution can have a significant impact on the uniformity of deposition. This non-uniform temperature distribution can come from heater element layout, local features like lift pin holes, non-uniform radiative heat loss, non-uniform contact surface or gap, or other reasons.

It is increasingly necessary to rotate a heater/pedestal to get the best film uniformity during Chemical Vapor Deposition (CVD) and Atomic Layer Deposition (ALD) processes where heated pedestal is used. A typical issue with rotating pedestal designs is that the rotating assembly becomes very complex. Installing or removing the pedestal requires disconnecting vacuum feeds, electrical feeds and resistance temperature detectors (RTD). Typical RTD sensor assemblies for monitoring temperature are designed such that the RTD sensor is located at the tip of the assembly and the other end has connecting/signal wires which connects to an RTD converter box. This RTD assembly is then inserted inside the pedestal after it is installed in the chamber from the bottom. However, with the rotating mechanism disposed below the chamber, it makes it difficult for one to install or remove the RTD assembly without damaging the part. There is also a considerable amount of time required to install/remove the RTD assembly.

Therefore, there is a need in the art for apparatus and methods to improve heater and RTD assembly installation and removal for rotating heater pedestals.

SUMMARY

Embodiments of the present disclosure are directed to a quick disconnect resistance temperature detector (RTD) heater assembly. In some embodiments consistent with the present disclosure, a quick disconnect resistance temperature detector (RTD) heater assembly, including a first assembly that includes a pedestal, a pedestal shaft coupled to the bottom of the pedestal, an adapter coupled to the pedestal shaft, one or more heater power supply terminals disposed in through holes formed in the pedestal shaft and adapter, and at least one RTD disposed in through holes formed in the pedestal, pedestal shaft and adapter; and a second assembly including a rotating module having a central opening, and a cable assembly partially disposed in the central opening and securely fastened to the rotating module, wherein the first assembly is removably coupled to the second assembly, wherein the cable assembly includes one or more power supply sockets that receive the heater power supply terminals when the first and second assemblies are coupled together, and wherein the cable assembly includes one or more spring loaded RTD pins that contact the at least one RTD disposed in the first assembly when the first and second assemblies are coupled together.

In some embodiments, A quick disconnect resistance temperature detector (RTD) heater assembly may include a first assembly including a plurality of heater power supply terminals and at least one RTD, wherein the RTD includes an RTD sensor portion, a protective sleeve, and an RTD connector housing having a plurality of copper contact pads; and a second assembly including a plurality of power supply sockets and a plurality of spring loaded RTD pins, wherein the first assembly is removably coupled to the second assembly, wherein the one or more power supply sockets are configured to receive the heater power supply terminals when the first and second assemblies are coupled together, and wherein the one or more spring loaded RTD pins contact the plurality of copper contact pads when the first and second assemblies are coupled together.

In some embodiments, a process chamber including a rotatable substrate support heater pedestal including a chamber body having sidewalls, a bottom, and a removable lid assembly that encloses a process volume; and a quick disconnect resistance temperature detector (RTD) heater assembly including a first assembly disposed including a plurality of heater power supply terminals and at least one RTD, wherein the first assembly is configured to be installed and removed from a top opening in the process chamber; and a second assembly including a plurality of power supply sockets and a plurality of spring loaded RTD pins, wherein the second assembly is secured below the bottom of the chamber body, wherein the first assembly is removably coupled to the second assembly, wherein the one or more power supply sockets are configured to receive the heater power supply terminals when the first and second assemblies are coupled together, and wherein the one or more spring loaded RTD pins contact the at least one RTD when the first and second assemblies are coupled together.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
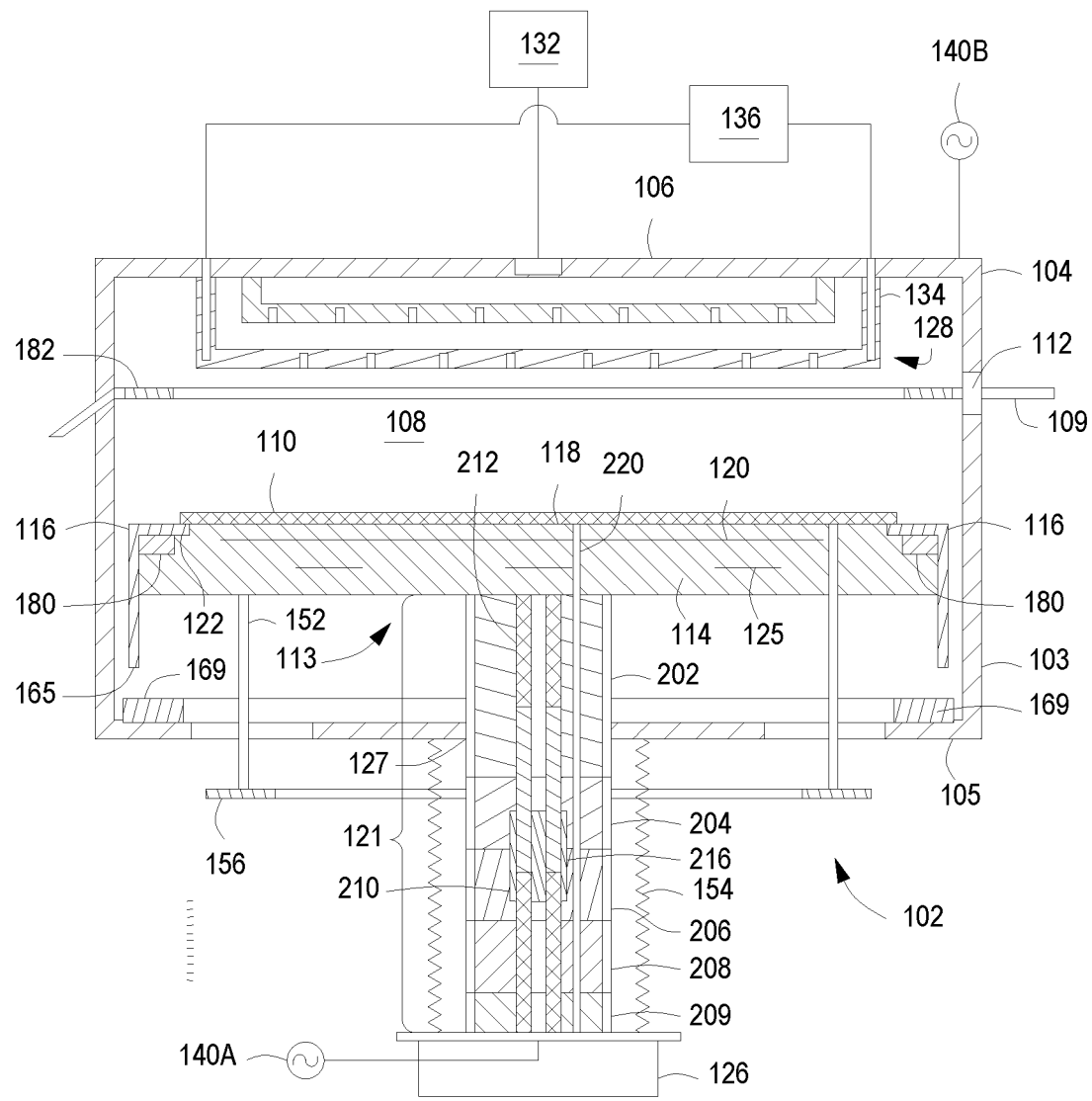
FIG. 1 shows a side cross-sectional view of a processing chamber in accordance with one or more embodiment of the disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure are directed to quick disconnect resistance temperature detector (RTD) assemblies for use with an in-chamber heater and substrate rotating mechanism. In embodiments consistent with the present disclosure, the RTD assembly is divided into two sections, where a first part of the RTD assembly stays within a removable pedestal/heater assembly, and where a second part of the RTD assembly stays with the rotating module assembly the is securely fixed within the process chamber making installation or servicing the chamber very easy and reduces parts damage. More specifically, CVD and ALD rotating pedestal assemblies consistent with the present disclosure may consist of rotating shaft, plug for the heater power, and long captive screws for the implementing "Plug and Play" technique during heater installation. The rotating shaft has a through hole where cable assembly is inserted and installed for heater power supply and signal transmission. In embodiments discussed herein, a thermocouple (TC) may be used where an RTD is described.

FIG. 1 depicts a side cross-sectional view of a process chamber 100 in accordance with one or more embodiment of the disclosure. First, the general configuration of a process chamber is described followed by more specific embodiments directed to the quick disconnect resistance temperature detector (RTD) heater assembly 101 for use with an in-chamber heater and substrate rotating mechanism.

The process chamber 100 includes a chamber body 104 with a sidewall 103, a bottom 105 and a removable lid assembly 106 that encloses a process volume 108. The substrate support system 102 is at least partially disposed in the process volume 108 and can support a substrate 110 that has been transferred to the process volume 108 through a port 112 formed in the chamber body 104. A process kit is included in the processing volume 108 that includes at least one of an upper edge ring 116, a lower edge ring 180, a bottom plate 169, and/or a shadow ring 182.

The substrate support system 102 includes a primary substrate support 113, such as a pedestal 114 and a thermal element 120. In addition, portions of the process kit comprise a secondary substrate support 115, such as an upper edge ring 116 and lower edge ring 180. The secondary substrate support 115 may be used to intermittently support the substrate 110 above the primary substrate support 113. The pedestal 114 includes a support surface 118 that is adapted to contact (or be in proximity to) a major surface of the substrate 110 during processing. Thus, the pedestal 114 serves as a primary supporting structure for the substrate 110 in the process chamber 100.

The pedestal 114 may include a thermal element 120 to control the temperature of the substrate 110 during processing. The thermal element 120 can be, for example, a heater or cooler that is positioned on top of the pedestal 114 or within the pedestal. The heater or cooler can be a separate component that is coupled to the top of the pedestal 114 or can be an integral part of the pedestal 114. In some embodiments, the thermal element 120 is embedded within the pedestal body (as shown in FIG. 1). In one or more embodiment, the embedded thermal element 120 may be a heating or cooling element or channel, utilized to apply thermal energy to the pedestal 114 body that is absorbed by the substrate 110. Other elements may be disposed on or embedded within the pedestal 114, such as one or more electrodes, sensors and/or vacuum ports. The temperature of the substrate 110 may be monitored by one or more RTDs 220. The embedded thermal element 120 may be zone controlled such that temperature at different areas of the pedestal 114 body may be individually heated or cooled. However, due to extenuating factors, such as imperfections in the pedestal 114 and/or non-uniformities in the substrate 110, the embedded thermal element 120 may not be able to apply thermal energy uniformly across the entire support surface 118 and/or the substrate 110. These extenuating factors can create non-uniform temperature distribution across the substrate 110, which can result in non-uniform processing of the substrate.

The pedestal 114 can be coupled to an actuator 126 via the shaft assembly 121, comprised of pedestal shaft 202, adapter 204, rotation module 206, and optionally water feedthrough 208 and slip ring 209, that provides one or more of vertical movement (in the z-axis), rotational movement (about axis A) and may also provide angular movement (relative to axis A). Vertical movement may be provided by the actuator 126 to allow the substrate 110 to be transferred between the upper edge ring 116 and the support surface 118. The shaft assembly 121 passes through the bottom 105 of the processing chamber 100 via opening 127. An isolated processing environment can be preserved by bellows 154 surrounding opening 127 and connected to a portion of the composite shaft assembly 121.

The substrate 110 is brought into the process volume 108 by robot 109 through port 112 in the sidewall 103 of the process chamber 100. The port 112 can be, for example, a slit valve.

The process chamber 100 may be a CVD, ALD or other type of deposition chamber, an etch chamber, an ion implant chamber, a plasma treatment chamber, or a thermal process chamber, among others. In the embodiment shown in FIG. 1, the process chamber is a deposition chamber and includes a showerhead assembly 128. The process volume 108 may be in selective fluid communication with a vacuum system 130 to control pressures therein. The showerhead assembly 128 may be coupled to a process gas source 132 to provide process gases to the process volume 108 for depositing materials onto the substrate 110. The showerhead assembly 128 may also include a temperature control element 134 for controlling the temperature of the showerhead assembly 128. The temperature control element 134 may be a fluid channel that is in fluid communication with a coolant source 136.

In some embodiments, the pedestal 114 may be an electrostatic chuck and the pedestal 114 may include one or more electrodes 125 (as shown in FIG. 1). For example, the pedestal 114 may be coupled to a power element 140A that may be a voltage source providing power to the one or more electrodes 125. The voltage source may be a radio frequency (RF) controller or a direct current (DC) controller. In another example, the pedestal 114 may be made of a conductive material and function as a ground path for RF power from a power element 140B distributed by the showerhead assembly 128. Thus, the process chamber 100 may perform a deposition or etch process utilizing RF or DC plasmas. As these types of plasmas may not be perfectly concentric or symmetrical, RF or DC hot spots (i.e., electromagnetic hot spots) may be present on the substrate 110. These electromagnetic hot spots may create non-uniform deposition or non-uniform etch rates on the surface of the substrate 110.

To counter the thermal non-uniformity that may be present on the surface of the substrate 110 (which may be determined by monitoring temperature of the substrate 110), the substrate 110 may be repositioned relative to the support surface 118. The hot or cold spots present on the surface of the substrate 110 are indicative of hot or cold spots in or on the support surface 118 of the pedestal body. The primary substrate support 113 is rotated with actuator 126 by a predetermined amount. After rotation, the decoupled substrate 110 and support surface 118 are re-coupled, moving the primary substrate support 113 upward to a position where the substrate 110 and support surface are 118 touching. This coupling/process/de-coupling/rotation cycle is repeated until the process is completed.

As discussed above, a typical issue with rotating pedestal designs is that the rotating assembly becomes very complex. Installing or removing the pedestal requires disconnecting vacuum feeds, electrical feeds and RTDs. In some embodiments, the quick disconnect RTD heater assembly 101 may be comprised of pedestal 114, the pedestal shaft 202, adapter 204, rotation module 206, water feedthrough 208, and slip ring 209. In some embodiments, the quick disconnect RTD heater assembly 101 is divided into two sections. The first part 200 of the quick disconnect RTD heater assembly 101 is comprised of the pedestal shaft 202 and adapter 204 and is couple to the pedestal 114. This first part 200 can be installed and removed from the top of the chamber 100. The second part 201 of the quick disconnect RTD heater assembly 101 is comprised of the rotation module 206. In some embodiments, the second part 201 of the quick disconnect RTD heater assembly 101 may also include water feedthrough 208 and/or slip ring 209. The second part 201 of the quick disconnect RTD heater assembly 101 stays within the chamber (i.e., is fixed within the chamber) which advantageously makes installation or servicing the chamber very easy and reduces parts damage. As described above, the first part 200 and second part 201 of the quick disconnect RTD heater assembly 101 separate between adapter 204 and rotating module 206.

Figure 2:
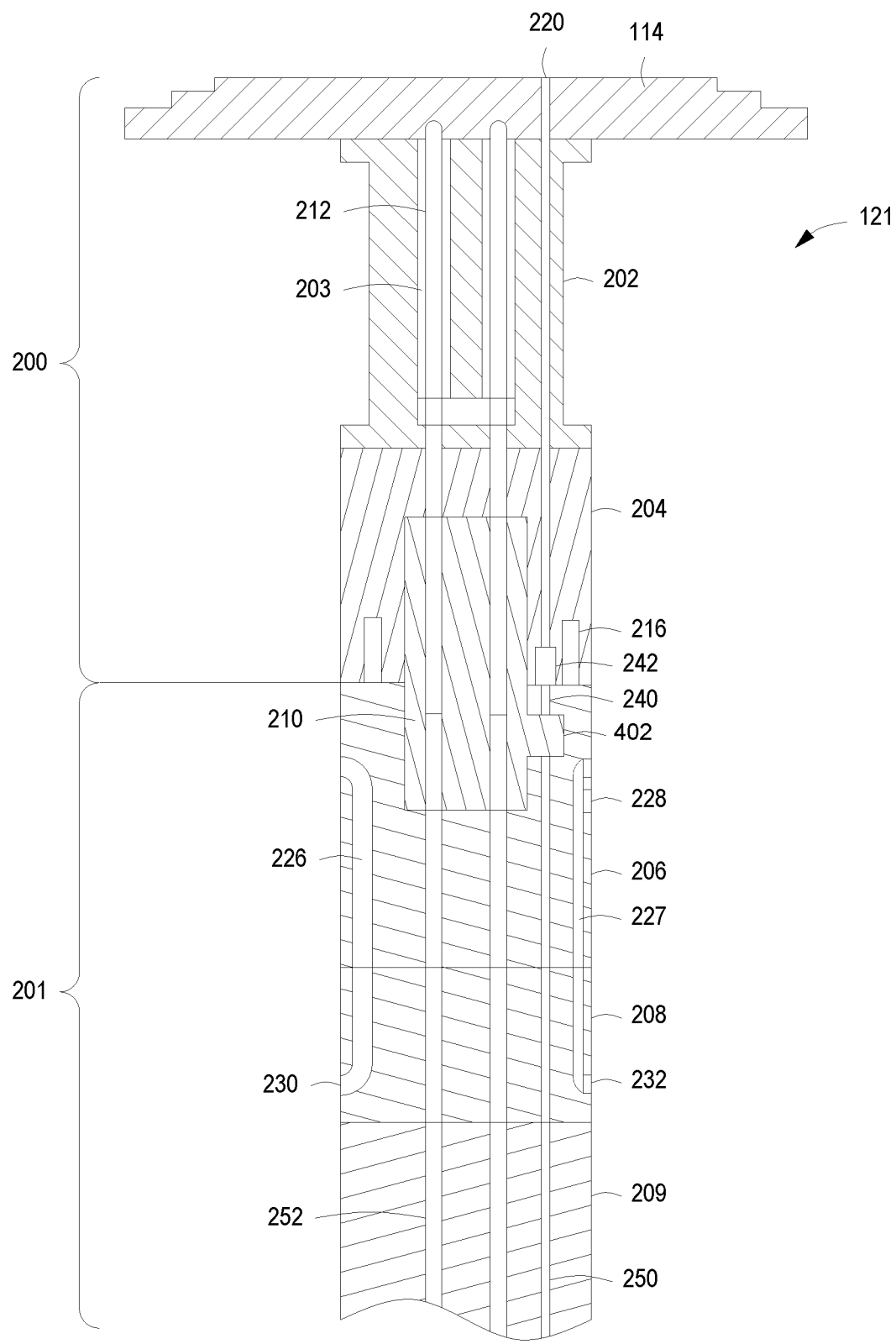
FIG. 2 shows a partial side cross-sectional view of a quick disconnect RTD assembly in accordance with one or more embodiment of the disclosure.

The components of the quick disconnect RTD heater assembly 101 are discussed below in further detail with respect to FIG. 1-4B. As shown in FIGS. 1 and 2, the pedestal 114 is coupled to the pedestal shaft 202. The pedestal shaft 202 has through holes 203 that allow power supply terminals 212 to pass through and provide power to the thermal element 120 in the heater pedestal 114. Each heating zone on in pedestal 114 used 2 pins (i.e., power supply terminals 212) to provide power to the heating zone. Thus, for a 2 zone heater, 4 pins would be used and would pass through pedestal shaft 202, for a 3 zone heater, 6 pins would be used. In addition to the power supply terminals 212, the RTD 220 also passes though pedestal shaft 202 and pedestal 114 such that the RTD extends to the surface of pedestal 114.

Figure 3B:
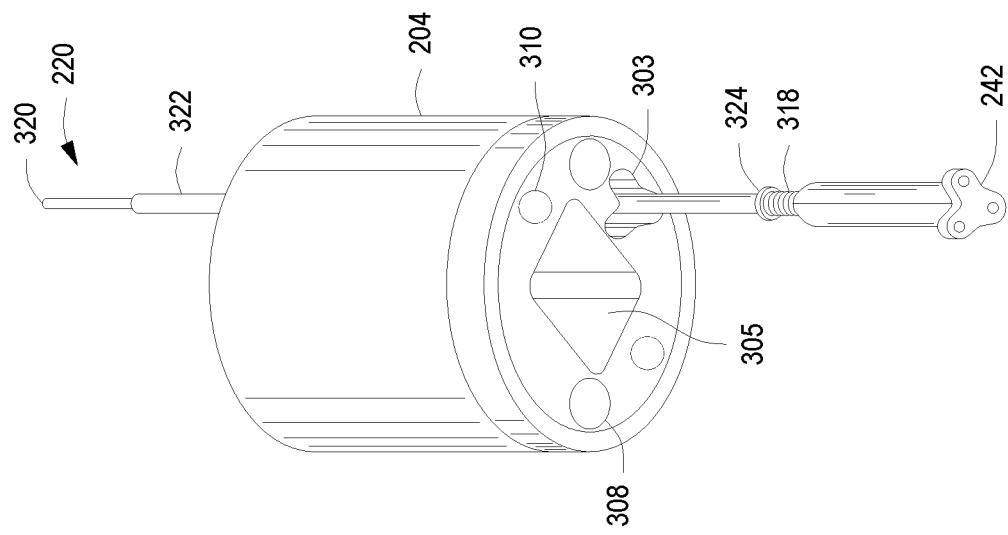
FIG. 3B depicts an isometric view of the adapter and RTD probe in accordance with one or more embodiment of the disclosure.
Figure 3A:
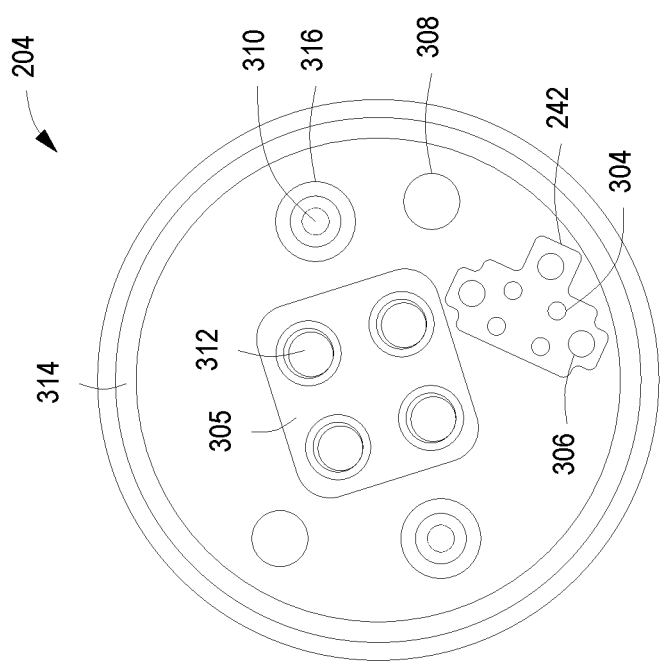
FIG. 3A depicts a bottom view of the adapter in accordance with one or more embodiment of the disclosure.

The adapter 204 is coupled to the pedestal shaft 202. As discussed above, the pedestal shaft 202, adapter 204, and pedestal 114 make up the first part 200 of the quick disconnect RTD heater assembly 101 that can be installed and removed from the top of the chamber 100. As shown in FIG. 3A, the adapter 204 includes through holes 312 that allow power supply terminals 212 to pass through and provide power to the thermal element 120 in the heater pedestal 114. The through holes 312 in the adapter 204 align with the through holes 203 in pedestal shaft 202. In some embodiments, the adapter 204 includes one or more screw holes 310 in order to securely couple the adapter 204 to pedestal shaft 202 with screws. In some embodiments, the one or more screw holes 310 may align with screw holes in the pedestal shaft 202 to securely couple the pedestal shaft 202 and adapter 204 to pedestal 114 with screws. Each screw hole 310 may include an O-ring 316 to seal the holes and prevent any gas, pressure or vacuum leaks (i.e., from the chamber). Similarly the entire bottom portion of the adapter 204 may include an O-ring 314 to prevent gas, pressure or vacuum leaks from the chamber 100.

In some embodiments, the adapter 204 includes one or more alignment pin holes 308 that do not pass all the way through the adapter 204. The alignment pin holes 308 are configured to receive alignment pins 216 from the rotating module 206 for alignment purposes. An opening 303 is formed in the adapter 204 to allow the RTD 220 to pass through. As shown in FIG. 3B, the RTD 220 includes a sensor portion 320 and a protective sleeve 322. In some embodiments, the sleeve 322 is made of stainless steel. In some embodiments, the sleeve may provide protection/isolation from other signals to protect against erroneous measurements. The RTD may further include a spring 318 with a collar 324 that is welded to the sleeve. As shown in FIGS. 2, 3A and 3B, the RTD further includes a RTD connector housing 242. The RTD connector housing 242 includes a plurality of contact pads 304. In some embodiments, as shown in FIG. 3A, the RTD connector housing 242 include four contact pads 304. In some embodiments, the contact pads 304 may be made of copper and contact the spring loaded RTD pins 240 of the cable assembly housing 210 (described below with respect to FIGS. 4A and 4B. The RTD connector housing 242 may be secured to the adapter 204 via fasteners 306. In some embodiments, the fasteners 306 may be screws. The adapter 204 also has an opening 305 that is configured to receive the upper portion of cable assembly housing 210 when the adapter 204 and rotating module 206 are coupled.

Figure 4B:
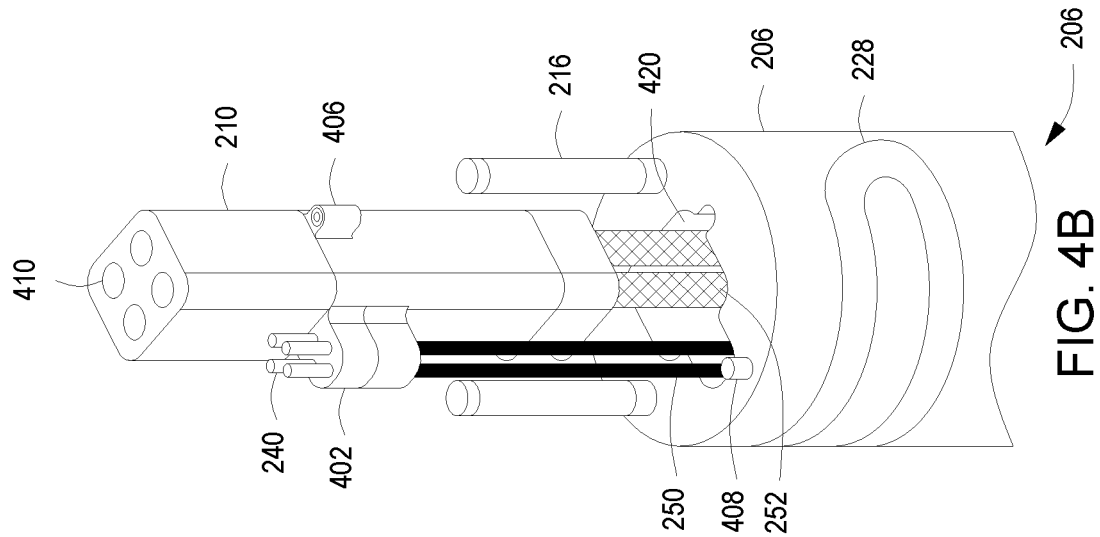
FIG. 4B depicts an isometric view of the rotating module and cable housing in accordance with one or more embodiment of the disclosure.
Figure 4A:
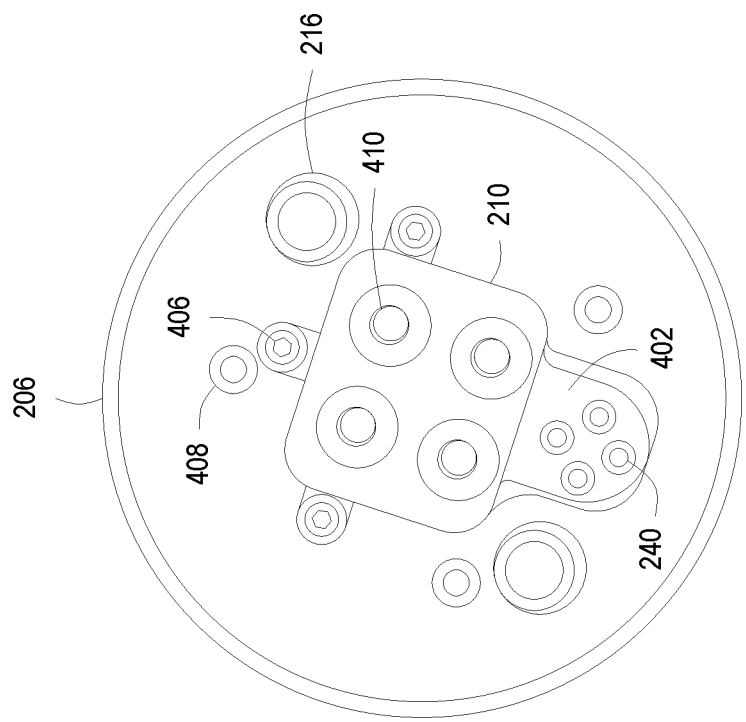
FIG. 4A depicts a top view of the rotating module and cable housing in accordance with one or more embodiment of the disclosure.

FIGS. 4A and 4B depict the details of rotating module 206. As shown in FIGS. 4A and 4B, the rotating module 206 includes one or more alignment pins 216. The alignment pins 216 are disposed on the top of rotating module 206 to ensure precise alignment of captive screws 408 to the threaded screw 310 holes on adapter 204, and alignment of the spring loaded pins 240 to the contact pads 304 of the RTD connector housing 242 during heater installation. The captive screws 408 are used to attach the first part 200 of the quick disconnect RTD assembly (i.e., pedestal 114, pedestal shaft 202, and adapter 204) to the rotating module 206.

During operation, the heater could be 500-550 degrees Celsius. In order keep the connections and adapter area cool, the rotating module 206 includes a cooling channel 228 formed on the outer surface of the rotating module 206. In some embodiments, a sleeve or insert is fitted over coolant channels 228 to contain the coolant within channel 228. Coolant is supplied to cooling channel 228 via conduit 226 formed within rotating module 206 as shown in FIG. 2. Coolant is supplied to conduit 226 via conduit 230 formed in the water feedthrough 208. The coolant exits the rotating module 206 via conduit 227 and then through outlet 232 in the water feedthrough 208.

FIGS. 4A and 4B also depict the details of the cable assembly 210. As shown in FIGS. 4A and 4B, the cable assembly 210 fits into opening 420 of the rotating module 206. A top portion of the cable assembly 210 will extend above the top surface of the rotating module 206 will fit into opening 305 of adapter 204. The cable assembly 210 includes one or more coupling features 406 for securing the cable assembly 210 to the rotating module 206. In some embodiments, screws may be used to secure the cable assembly 210 to rotating module 206 via coupling features 406. The cable assembly 210 includes a plurality of power supply sockets 410 where AC power supply terminal pins 212 are plugged in during heater installation. The bottom of the power supply sockets 410 are coupled to power supply cables 252.

The cable assembly 210 includes an RTD pin support 402 disposed on the side of the cable assembly 210. The spring loaded pins 240 are supported by RTD pin support 402. In some embodiments, there may be one or more spring loaded pins 240. In some embodiments, the number of spring loaded pins 240 will be equal to the number of contact pads 304 of the RTD connector housing 242. The bottom of the spring-loaded pins 240 are attached to signal cables 250. In some embodiments where additional temperature zones may be monitored, additional RTD pin supports 402 may be disposed on other sides of cable assembly 210 with an additional plurality of spring loaded pins 240 supported thereon. These additional spring-loaded pins 240 would contact additional contact pads 304 disposed on the bottom of adapter 204. Thus, for example, instead of four RTD signal wires to measure a single zone, you could have eight RTD signal wires and associate connections to monitor temperate in two separate areas of pedestal 114.

While the foregoing is directed to embodiments of the present disclosure, other and further embodiments of the disclosure may be devised without departing from the basic scope thereof.

The invention claimed is:

1. A quick disconnect resistance temperature detector (RTD) heater assembly, comprising:
a first assembly comprising a pedestal, a pedestal shaft coupled to a bottom of the pedestal, an adapter coupled to the pedestal shaft, one or more heater power supply terminals disposed in through holes formed in the pedestal shaft and adapter, and at least one RTD disposed in through holes formed in the pedestal, pedestal shaft and adapter; and
a second assembly comprising a rotating module having a central opening, and a cable assembly partially disposed in the central opening and securely fastened to the rotating module,
wherein the first assembly is removably coupled to the second assembly, wherein the cable assembly includes one or more power supply sockets that receive the heater power supply terminals when the first and second assemblies are coupled together, and wherein the cable assembly includes one or more spring loaded RTD pins that contact the at least one RTD disposed in the first assembly when the first and second assemblies are coupled together.

2. The quick disconnect RTD heater assembly of claim 1, wherein the adapter has a central opening formed in a bottom surface of the adapter, and wherein a top portion of the cable assembly is disposed within the central opening of the adapter when the first and second assemblies are coupled together.

3. The quick disconnect RTD heater assembly of claim 1, wherein the RTD disposed in the first assembly includes an RTD sensor portion, a protective sleeve, a spring with a collar that is welded to the sleeve, and an RTD connector housing.

4. The quick disconnect RTD heater assembly of claim 3, wherein the RTD connector housing includes a plurality of copper contact pads that contact the one or more spring loaded RTD pins when the first and second assemblies are coupled together.

5. The quick disconnect RTD heater assembly of claim 4, wherein each copper contact pads contacts a single spring loaded RTD pin when the first and second assemblies are coupled together.

6. The quick disconnect RTD heater assembly of claim 1, wherein the rotating module includes at least one captive screw and at least one alignment pin on a top surface of the rotating module.

7. The quick disconnect RTD heater assembly of claim 6, wherein the adapter includes at least one alignment hole and at least one captive screw hole formed in a bottom surface of the adapter.

8. The quick disconnect RTD heater assembly of claim 7, wherein the alignment pins fit into corresponding alignment holes and ensure alignment of the at least one captive screw, and alignment of the spring loaded pins to corresponding contact pads of the at least one RTD disposed in the first assembly.

9. The quick disconnect RTD heater assembly of claim 7, wherein each captive screw hole includes an o-ring to maintain a vacuum seal.

10. The quick disconnect RTD heater assembly of claim 1, wherein the rotating module includes a coolant channel formed in an outer surface of the rotating module.

11. The quick disconnect RTD heater assembly of claim 10, wherein the second assembly further comprises a water feedthrough coupled to a bottom of the rotating module, and wherein the water feedthrough provides coolant to the coolant channel.

12. The quick disconnect RTD heater assembly of claim 11, wherein the second assembly further comprises a slip ring coupled to a bottom of the water feedthrough.

13. The quick disconnect RTD heater assembly of claim 1, wherein the pedestal shaft, adapter, and rotation module form a shaft assembly when the first and second assemblies are couple together, and wherein the pedestal is coupled to an actuator via the shaft assembly that provides one or more of vertical movement, rotational movement, and angular movement.

14. A quick disconnect resistance temperature detector (RTD) heater assembly, comprising:
a first assembly including a plurality of heater power supply terminals and at least one RTD, wherein the RTD includes an RTD sensor portion, a protective sleeve, and an RTD connector housing having a plurality of copper contact pads; and
a second assembly including a cable assembling having a plurality of power supply sockets and a plurality of spring loaded RTD pins, wherein the cable assembly includes an RTD pin support disposed on a side of the cable assembly, and wherein the spring loaded RTD pins are supported by RTD pin support,
wherein the first assembly is removably coupled to the second assembly, wherein the plurality of power supply sockets are configured to receive the heater power supply terminals when the first and second assemblies are coupled together, and wherein the plurality of spring loaded RTD pins contact the plurality of copper contact pads when the first and second assemblies are coupled together.

15. A process chamber including a rotatable substrate support heater pedestal, comprising:
a chamber body having sidewalls, a bottom, and a removable lid assembly that encloses a process volume; and
a quick disconnect resistance temperature detector (RTD) heater assembly comprising:
a first assembly disposed including a plurality of heater power supply terminals and at least one RTD, wherein the first assembly is configured to be installed and removed from a top opening in the process chamber; and
a second assembly including a cable assembling having a plurality of power supply sockets and a plurality of spring loaded RTD pins, wherein the second assembly is secured below the bottom of the chamber body, wherein the cable assembly includes an RTD pin support disposed on a side of the cable assembly, and wherein the spring loaded RTD pins are supported by RTD pin support,
wherein the first assembly is removably coupled to the second assembly, wherein the plurality of power supply sockets are configured to receive the heater power supply terminals when the first and second assemblies are coupled together, and wherein the plurality of spring loaded RTD pins contact the at least one RTD when the first and second assemblies are coupled together.

16. The process chamber of claim 15, wherein the first assembly includes a pedestal that is disposed within the processing volume, a pedestal shaft coupled to the bottom of the pedestal, an adapter coupled to the pedestal shaft.

17. The process chamber of claim 16, wherein the second assembly includes a rotating module having a central opening, and wherein the cable assembly is partially disposed in the central opening and securely fastened to the rotating module.

18. The process chamber of claim 15, wherein the RTD includes an RTD sensor portion that extends to a support surface of the pedestal, and an RTD connector housing having a plurality of copper contact pads that contact the one or more spring loaded RTD pins when the first and second assemblies are coupled together.

19. The quick disconnect RTD heater assembly of claim 1, wherein the cable assembly includes an RTD pin support disposed on the side of the cable assembly.

20. The quick disconnect RTD heater assembly of claim 19, wherein the spring loaded RTD pins are supported by RTD pin support.

* * * * *